(12) United States Patent
Lin et al.

(10) Patent No.: US 9,786,662 B1
(45) Date of Patent: Oct. 10, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chao-Hung Lin, Changhua County (TW); Shih-Hung Tsai, Tainan (TW); Jyh-Shyang Jenq, Pingtung County (TW); Yu-Hsiang Hung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/226,906

(22) Filed: Aug. 2, 2016

(30) Foreign Application Priority Data

Jun. 24, 2016 (CN) .......................... 2016 1 0472312

(51) Int. Cl.
*H01L 27/088* (2006.01)
*H01L 29/49* (2006.01)
*H01L 29/66* (2006.01)
*H01L 29/78* (2006.01)
*H01L 21/3105* (2006.01)
*H01L 21/8234* (2006.01)

(52) U.S. Cl.
CPC .... *H01L 27/0886* (2013.01); *H01L 21/31053* (2013.01); *H01L 21/823431* (2013.01); *H01L 21/823481* (2013.01); *H01L 29/4966* (2013.01); *H01L 29/66553* (2013.01); *H01L 29/785* (2013.01)

(58) Field of Classification Search
CPC .......................... H01L 21/845; H01L 29/7831
USPC .......................................................... 257/401
See application file for complete search history.

(56) References Cited

U.S. PATENT DOCUMENTS

| | | | |
|---|---|---|---|
| 9,230,809 B2 | 1/2016 | Chang et al. | |
| 9,362,181 B1* | 6/2016 | Xie | ................. H01L 21/823878 |
| 2006/0240610 A1 | 10/2006 | Nowak et al. | |
| 2013/0187237 A1 | 7/2013 | Yu et al. | |
| 2015/0035069 A1 | 2/2015 | Hung et al. | |
| 2016/0056104 A1 | 2/2016 | Bouche et al. | |
| 2016/0056181 A1* | 2/2016 | Anderson | ........... H01L 27/1211 257/347 |

OTHER PUBLICATIONS

Chien-Ting Lin, Title of Invention: Semiconductor Device and Method for Fabricating the Same, U.S. Appl. No. 14/877,950, filed Oct. 8, 2015.

* cited by examiner

*Primary Examiner* — David Vu
*Assistant Examiner* — Brandon Fox
(74) *Attorney, Agent, or Firm* — Winston Hsu

(57) ABSTRACT

A method for fabricating semiconductor device is disclosed. First, a substrate is provided, a first gate pattern is formed on the substrate, a first spacer is formed around the first gate pattern, part of the first gate pattern is removed to form a first slot, a first dielectric layer is formed into the first slot, and a replacement metal gate (RMG) process is performed to transform part of the first gate pattern into a metal gate.

19 Claims, 11 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of removing part of a gate pattern after forming spacers.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, fin-shaped structure may be divided and insulating material is deposited to form shallow trench isolation (STI). However, the STI formed between fin-shaped structures often results in expansion and affects the formation of gate structure thereafter. Hence, how to improve the current FinFET fabrication and structure for resolving this issue has become an important task in this field.

SUMMARY OF THE INVENTION

According to a preferred embodiment of the present invention, a method for fabricating semiconductor device is disclosed. First, a substrate is provided, a first gate pattern is formed on the substrate, a first spacer is formed around the first gate pattern, part of the first gate pattern is removed to form a first slot, a first dielectric layer is formed into the first slot, and a replacement metal gate (RMG) process is performed to transform part of the first gate pattern into a metal gate.

According to another aspect of the present invention, a semiconductor device is disclosed. The semiconductor device includes: a first gate pattern and a second gate pattern on a substrate, in which the first gate pattern includes a first end and a second end and the second gate pattern includes a third end and a fourth end; a first dielectric pattern contacting the first end of the first gate pattern and the third end of the second gate pattern; a second dielectric pattern contacting the second end of the first gate pattern and the fourth end of the second gate pattern; and a first spacer around the first gate pattern, the second gate pattern, the first dielectric pattern and the second dielectric pattern.

According to yet another aspect of the present invention, a semiconductor device is disclosed. The semiconductor device includes: a first gate pattern and a second gate pattern on a substrate, in which the first gate pattern comprises a first end and a second end and the second gate pattern comprises a third end and a fourth end; and U-shaped dielectric pattern connecting the first gate pattern and the second gate pattern, in which two ends of the U-shaped dielectric pattern contacts the first end of the first gate pattern and the third end of the second gate pattern directly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
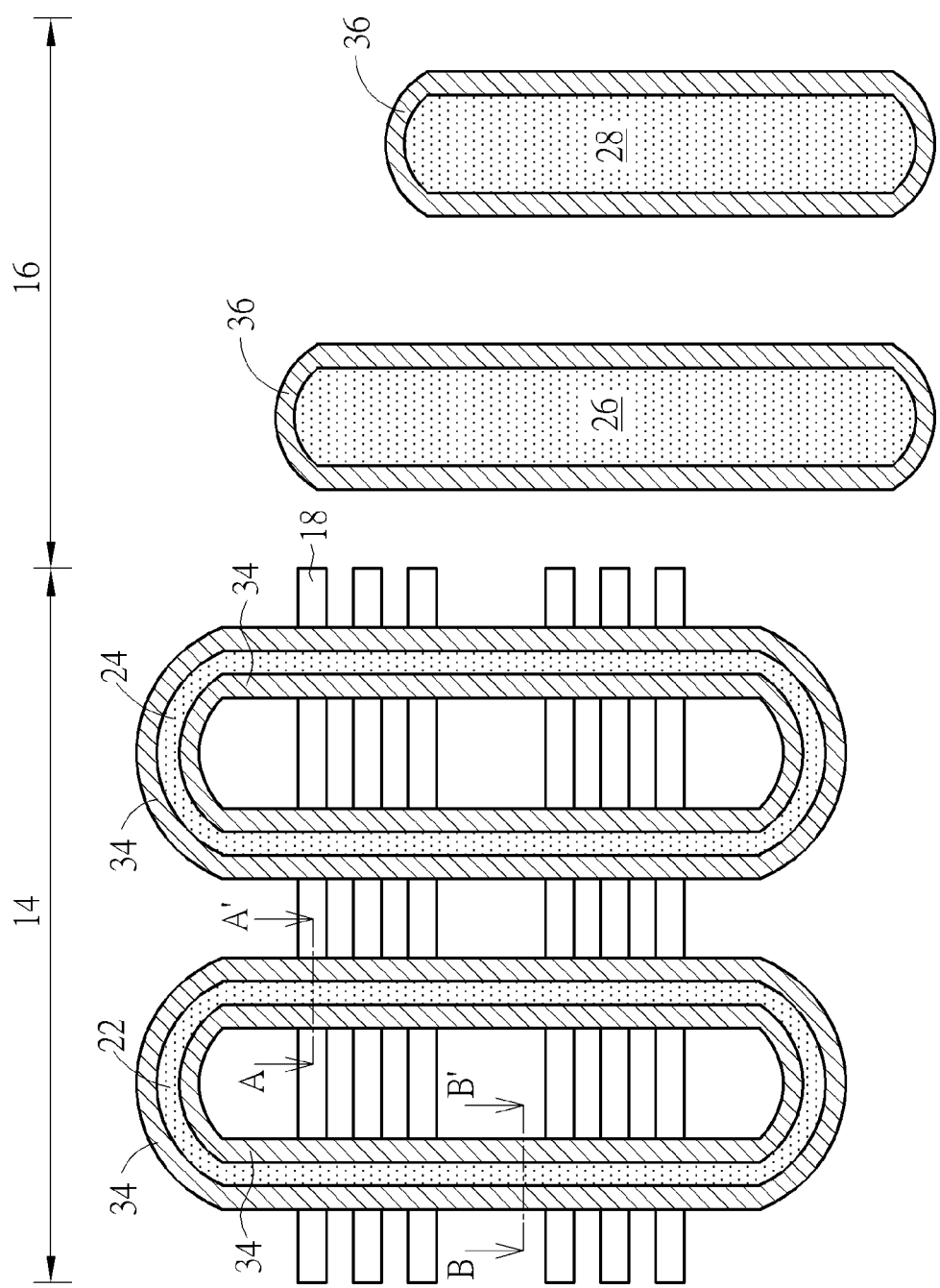
FIG. 1 is a top view illustrating a method for fabricating a semiconductor device according to a preferred embodiment of the present invention.
Figure 2:
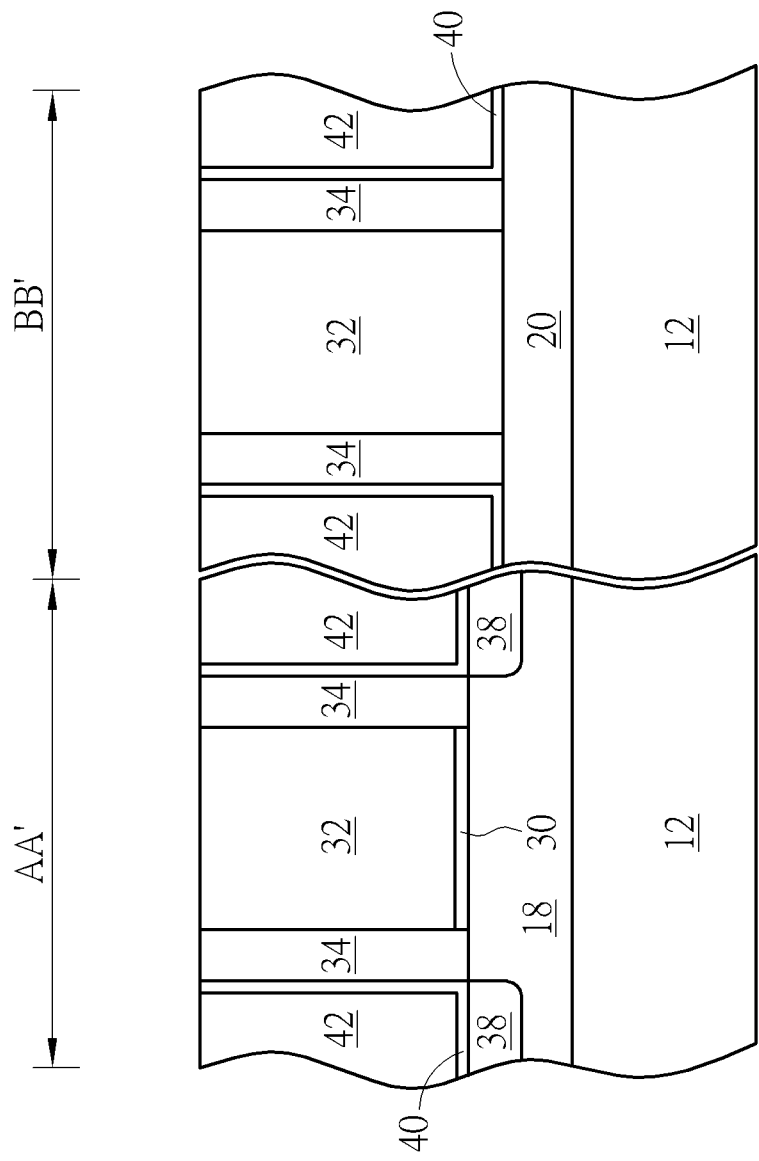
FIG. 2 is a cross-sectional view of the semiconductor device shown in FIG. 1.

Referring to FIGS. 1-11, FIGS. 1-11 illustrate a method for fabricating a semiconductor device according to a preferred embodiment of the present invention. First, referring to FIGS. 1-2, in which FIG. 1 is a top view illustrating a method for fabricating a semiconductor device according to a preferred embodiment of the present invention, the left portion of FIG. 2 is a cross-sectional view of FIG. 1 along the sectional line AA', and the right portion of FIG. 2 is a cross-sectional view of FIG. 1 along the sectional line BB'. As shown in FIGS. 1-2, a substrate 12, such as a silicon substrate or a silicon-on-insulator (SOI) substrate is provided. A first region 14 and a second region 16 are then defined on the substrate 12, in which the first region 14 and second region 16 are preferably difference device regions such as core region and peripheral region. In this embodiment, the first region 14 is preferably used for fabricating non-planar field effect transistors such as FinFET devices while the second region 16 is used for fabricating planar field effect transistors. Preferably, at least a fin-shaped structure 18 is disposed on the first substrate 14, in which the bottom of the fin-shaped structure 18 is surrounded by a shallow trench isolation (STI) 20 made of silicon oxide. It should be noted that even though six fin-shaped structures 18 are disclosed in this embodiment, the number or quantity of the fin-shaped structures 18 is not limited to six, but could be adjusted according to the demand of the product.

The fin-shaped structure 18 of this embodiment is preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 18 of this embodiment could also be obtained by first forming a patterned mask (not shown) on the substrate, 12, and through an etching process, the pattern of the patterned mask is transferred to the substrate 12 to form the fin-shaped structure 18. Moreover, the formation of the fin-shaped structure 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 18. These approaches for forming fin-shaped structure 18 are all within the scope of the present invention.

Next, gate structures or gate patterns 22, 24, 26, 28 are formed on the substrate 12 to intersect the fin-shaped structures 18. Preferably, the formation of the gate patterns 22, 24, 26, 28 could be accomplished by a gate first process, a high-k first approach from gate last process, or a high-k last approach from gate last process. Since this embodiment pertains to a high-k last approach, it would be desirable to sequentially deposit a gate dielectric layer or interfacial layer, a gate material layer, and a selective hard mask on the substrate 12, conduct a pattern transfer process by using a patterned resist (not shown) as mask to remove part of the gate material layer and part of the gate dielectric layer, and then strip the patterned resist to form gate patterns 22, 24, 26, 28 or gate structures on the fin-shaped structures 18 and the STI 20. Each of the gate patterns 22, 24, 26, 28 preferably includes a patterned gate dielectric layer 30 and a patterned gate material layer 32. It should be noted that only the gate patterns 26 and 28 are formed by using single or multiple pattern transfer process, whereas the gate patterns 22 and 24 are preferably formed by sidewall image transfer (SIT) process.

Viewing from the top view diagram of FIG. 1, the gate patterns 22 and 24 formed at this stage are preferably ring-shaped and the gate patterns 26 and 28 are strip-shaped, in which a width of each of the gate patterns 26 and 28 is greater than a width of each of the gate patterns 22 and 24. It should be noted that even though two ring-shaped gate patterns 22 and 24 and two strip-shaped gate patterns 26 and 28 are disclosed in this embodiment, the number or quantity of the gate patterns 22, 24, 26, 28 is not limited to the ones disclosed in this embodiment, but could all be adjusted according to the demand of the product.

Next, spacers 34 are formed around the gate patterns 22, 24 and spacer 36 are formed around the gate patterns 26, 28, a source/drain region 38 and/or epitaxial layer (not shown) is formed in the fin-shaped structure 18 and/or substrate 12 adjacent to two sides of the spacers 34, and a selective silicide (not shown) is formed on the surface of the source/drain region 38 and/or epitaxial layer. In this embodiment, each of the spacers 34, 36 could be a single spacer or a composite spacer. For instance, the spacer 34 could further include an offset spacer (not shown) and a main spacer (not shown). In this embodiment, the spacers 34, 36 are preferably made of silicon nitride, but could also be selected from the group consisting of $SiO_2$, SiON, and SiCN. The source/drain region 38 and epitaxial layer could include different dopants or different material depending on the type of transistor being fabricated. For instance, the source/drain region 38 could include p-type or n-type dopants and the epitaxial layer could include SiGe, SiC, or SiP.

Next, a contact etch stop layer (CESL) 40 composed of silicon nitride could be selectively formed on the substrate 12 to cover the gate patterns 22, 24, 26, 28 and an interlayer dielectric (ILD) layer 42 is formed on the CESL 40. Next, a planarizing process, such as chemical mechanical polishing (CMP) process is conducted to remove part of the ILD layer 42 and part of the CESL 40 to expose the gate material layer 32 composed of polysilicon, in which the top surface of the gate material layer 32 and the top surface of the ILD layer 42 are coplanar.

Figure 3:
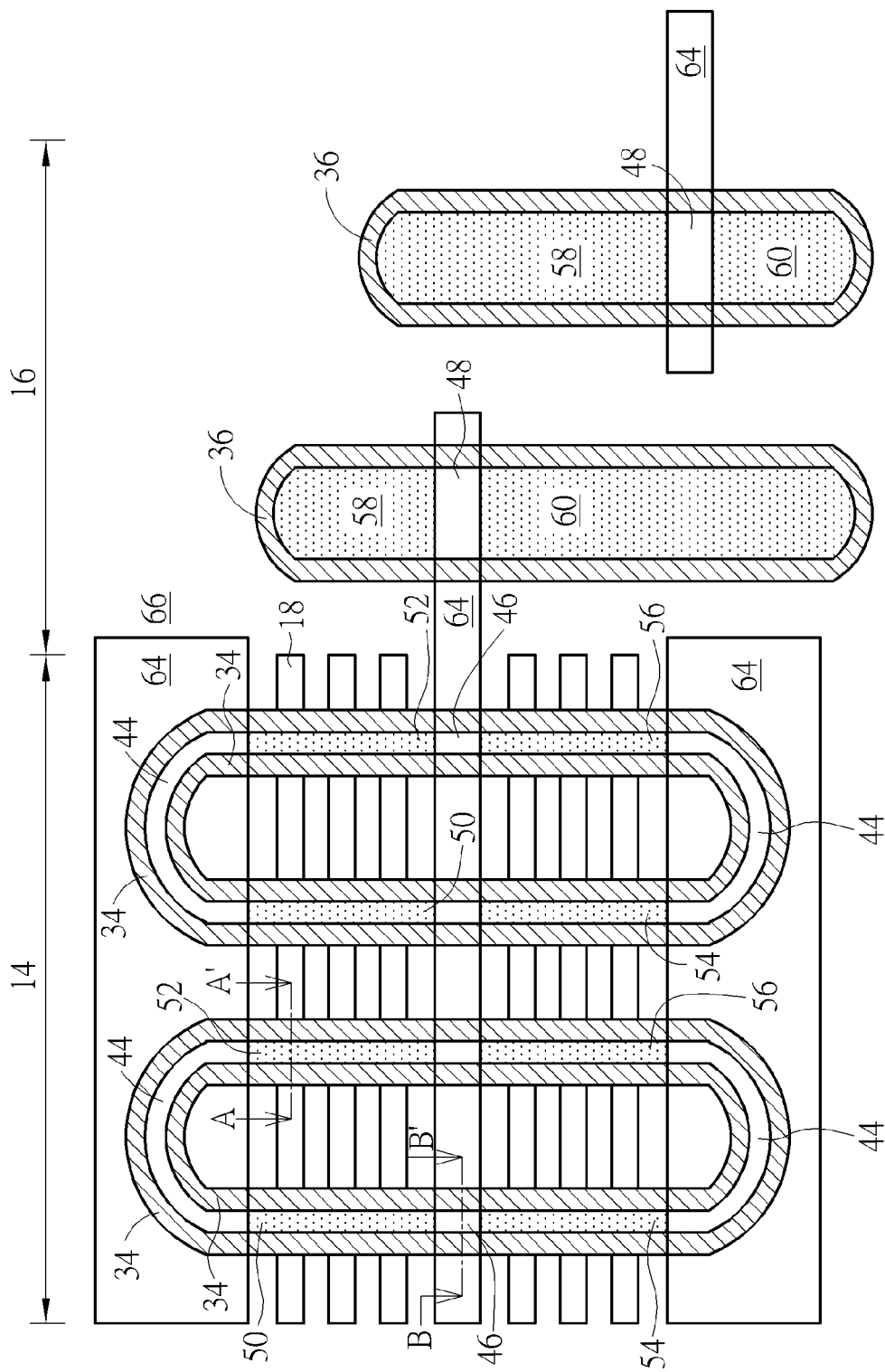
FIG. 3 is a top view illustrating a method for fabricating a semiconductor device following FIG. 1.
Figure 4:
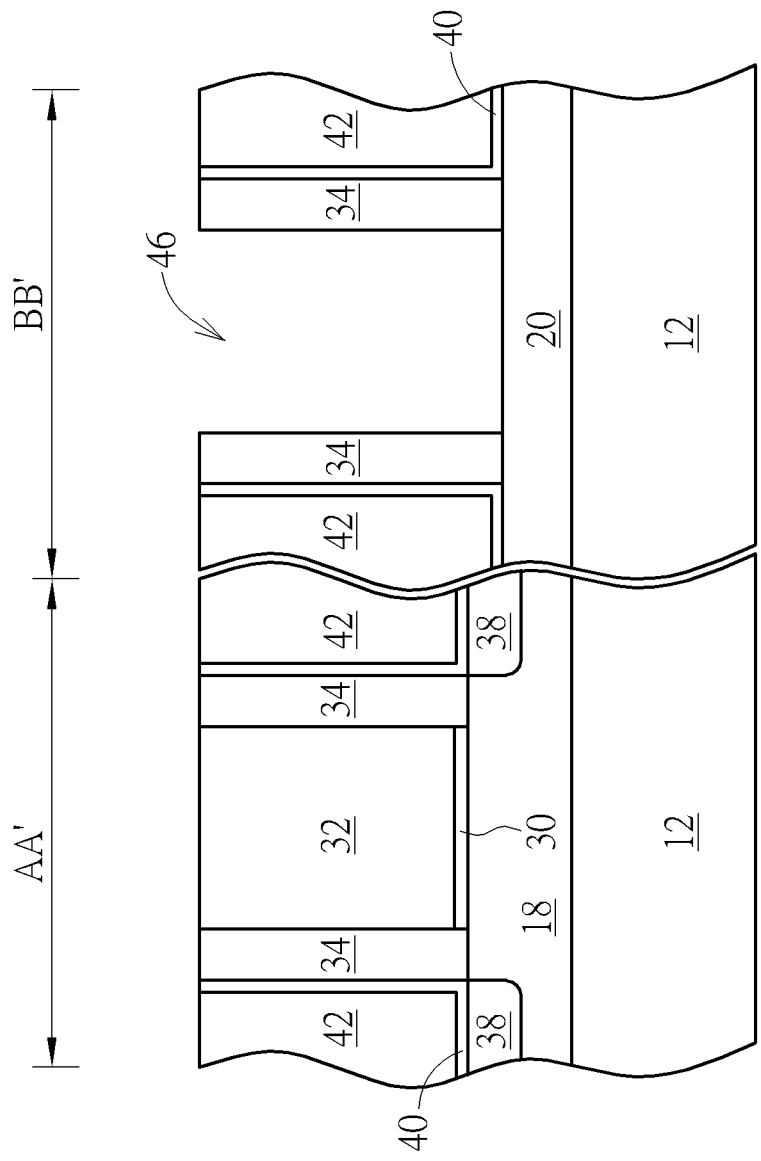
FIG. 4 is a cross-sectional view of the semiconductor device shown in FIG. 3.

Referring to FIGS. 3-4, in which FIG. 3 is a top view illustrating the method for fabricating a semiconductor device following FIG. 1, the left portion of FIG. 4 is a cross-sectional view of FIG. 3 along the sectional line AA', and the right portion of FIG. 4 is a cross-sectional view of FIG. 3 along the sectional line BB'. As shown in FIGS. 3-4, a photo-etching process is conducted by first forming a patterned mask 66 having an opening 64 that exposes part of the gate patterns 22, 24, 26, 28, and then removing part of the gate patterns 22, 24 to form slots 44, 46 and removing part of the gate patterns 26, 28 to form slots 48. Specifically, the etching process conducted at this stage preferably removes the head and tail portions of the ring-shaped gate patters 22, 24 to form slots 44 and also removes the middle portion of the gate patterns 22, 24 to form slots 46. By doing so, each of the ring-shaped gate patterns 22, 24 are divided into four strip-shaped gate patterns 50, 52, 54, 56, and each of the strip-shaped gate patterns 26, 28 are divided into two strip-shaped gate patterns 58, 60. As shown in FIG. 4, since the gate pattern being removed was disposed on the STI 20, the slot 46 formed thus exposes the surface of the STI 20.

It should be noted that since the materials of the gate patterns 22, 24, 26, 28 are preferably different from the spacers 34, 36, the ILD layer 42, and the CESL 42, it would be desirable to remove part of the gate patterns 22, 24, 26, 28 for forming slots 44, 46, 48 without removing any of the spacers 34, 36, ILD layer 42, and CESL 40. In other words, the spacers 34 36 would not be broken and would still surround the divided or separated gate patterns 50, 52, 54, 56, 58, 60 after the slots 44, 46, 48 are formed.

Figure 5:
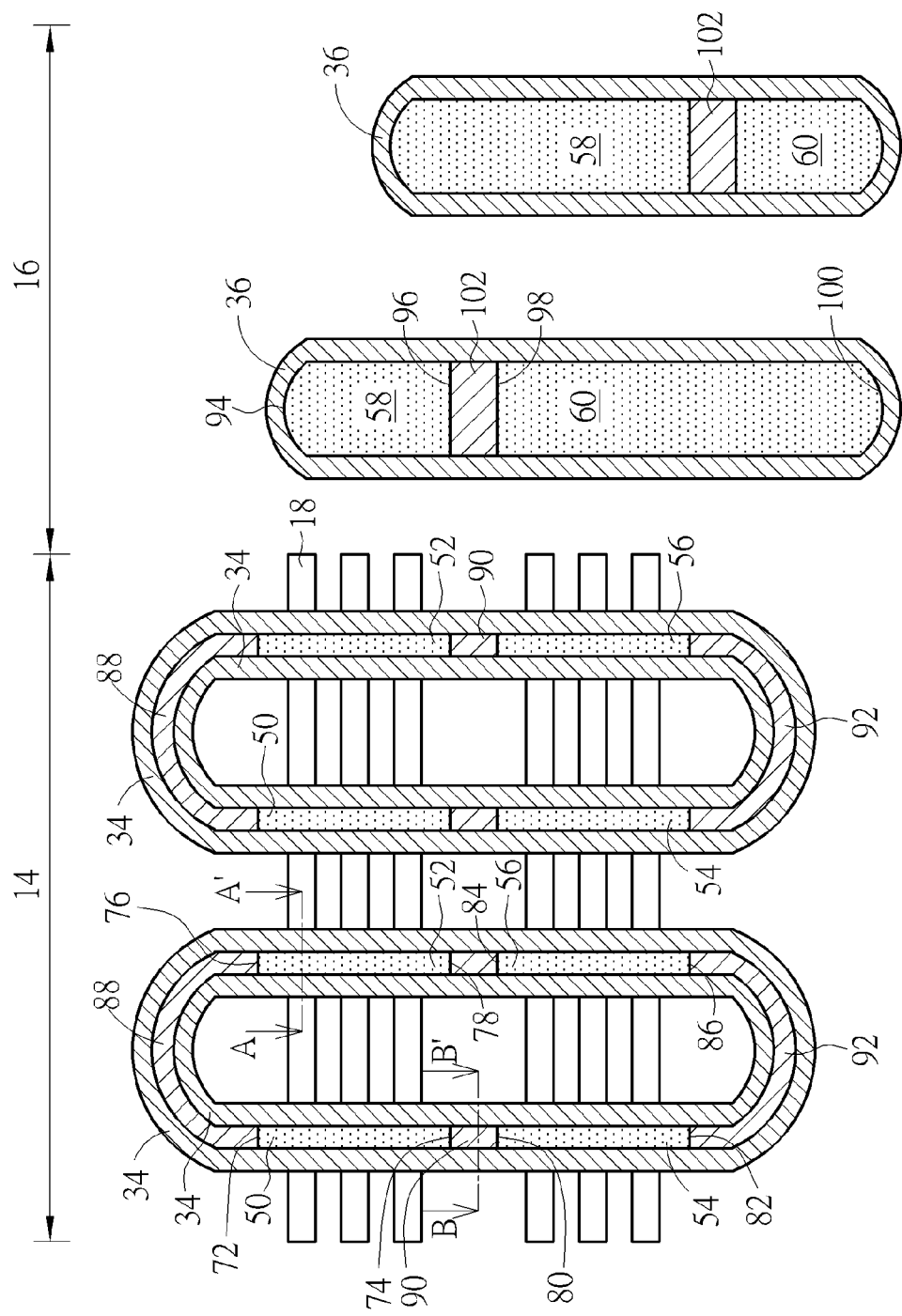
FIG. 5 is a top view illustrating a method for fabricating a semiconductor device following FIG. 3
Figure 6:
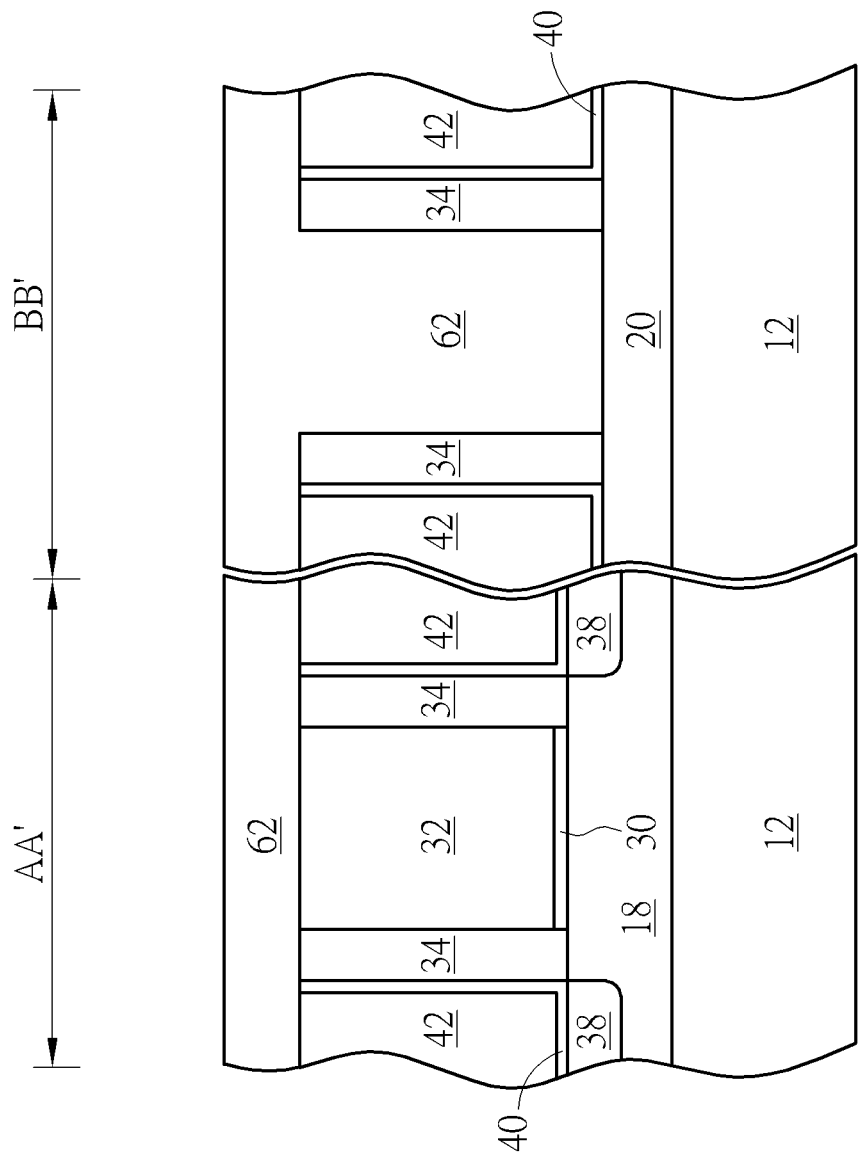
FIG. 6 is a cross-sectional view of the semiconductor device shown in FIG. 5.

Referring to FIGS. 5-6, in which FIG. 5 is a top view illustrating the method for fabricating a semiconductor device following FIG. 3, the left portion of FIG. 6 is a cross-sectional view of FIG. 5 along the sectional line AA', and the right portion of FIG. 6 is a cross-sectional view of FIG. 5 along the sectional line BB'. As shown in FIGS. 5-6, after stripping the patterned mask 66, a first dielectric layer 62 is formed into the slots 44, 46, 48, in which the first dielectric layer 62 not only fills the slots 44, 46, 48 completely but also covers the top surface of the ILD layer 42, the gate material layer 32 of the gate patterns 50, 52, 54, 56, 58, 60, and the fin-shaped structures 18. The first dielectric layer 62 is made of silicon nitride in this embodiment, but not limited thereto.

Viewing from a structural perspective, the gate pattern 50 on the first region 14 includes a first end 72 and a second end 74, the gate pattern 52 includes a third end 76 and a fourth end 78, the gate pattern 54 includes a fifth end 80 and a sixth end 82, and the gate pattern 56 includes a seventh end 84 and an eighth end 86. The first dielectric layer 62 preferably forms a first dielectric pattern 88 contacting the first end 72 of the gate pattern 50 and the third end 76 of the gate pattern 52, a second dielectric pattern 90 contacting the second end 74 of the gate pattern 50 and the fourth end 78 of the gate pattern 52, and a third dielectric pattern 92 contacting the sixth end 82 of the gate pattern 54 and the eighth end 86 of the gate pattern 56. The spacers 34 on the first region 14 are disposed to surround the gate patterns 50, 52, 54, 56, the first dielectric pattern 88, the second dielectric pattern 90, and the third dielectric pattern 92.

The gate pattern 58 on the second region 16 includes a ninth end 94 and a tenth end 86, the gate pattern 60 includes an eleventh end 98 and a twelfth end 100, and the first dielectric layer 62 preferably forms a fourth dielectric pattern 102 contacting the tenth end 96 of the gate pattern 58 and the eleventh end 98 of the gate pattern 60. The spacers 36 on the second region 16 are disposed around the gate patterns 58, 60 and the fourth dielectric pattern 102.

Viewing from another perspective, the gate patterns 50, 52 and the first dielectric pattern 88 together form a U-shape, and the gate patterns 54, 56 and the third dielectric pattern 92 also form another U-shape. It should be noted that even though each of the first dielectric pattern 88 and third dielectric pattern 92 is U-shaped, it would be desirable to adjust the position of the opening on the mask when parts of the gate patterns 22, 24 were removed from FIGS. 3-5, so that the slot 44 connecting the first end 72 of gate pattern 50 and the third end 76 of gate pattern 52 become I-shaped. By doing so, an I-shaped first dielectric pattern 88 would be formed, which is also within the scope of the present invention.

Figure 7:
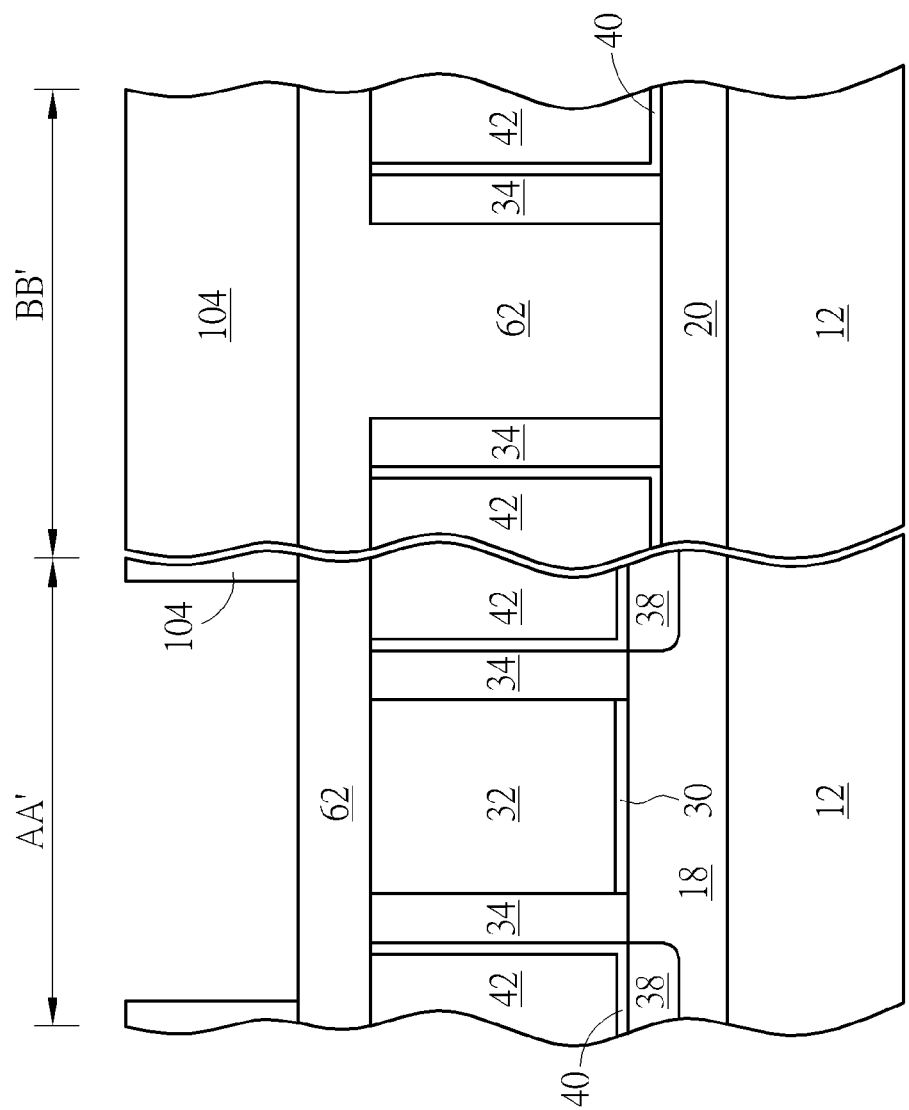
FIGS. 7-9 are cross-sectional views depicting an embodiment for fabricating a semiconductor device following FIG. 6.

Next, as shown in FIG. 7, a patterned mask, such as a patterned resist 104 is formed on the STI 20 to expose the first dielectric layer 62 on the fin-shaped structure 18.

Figure 8:
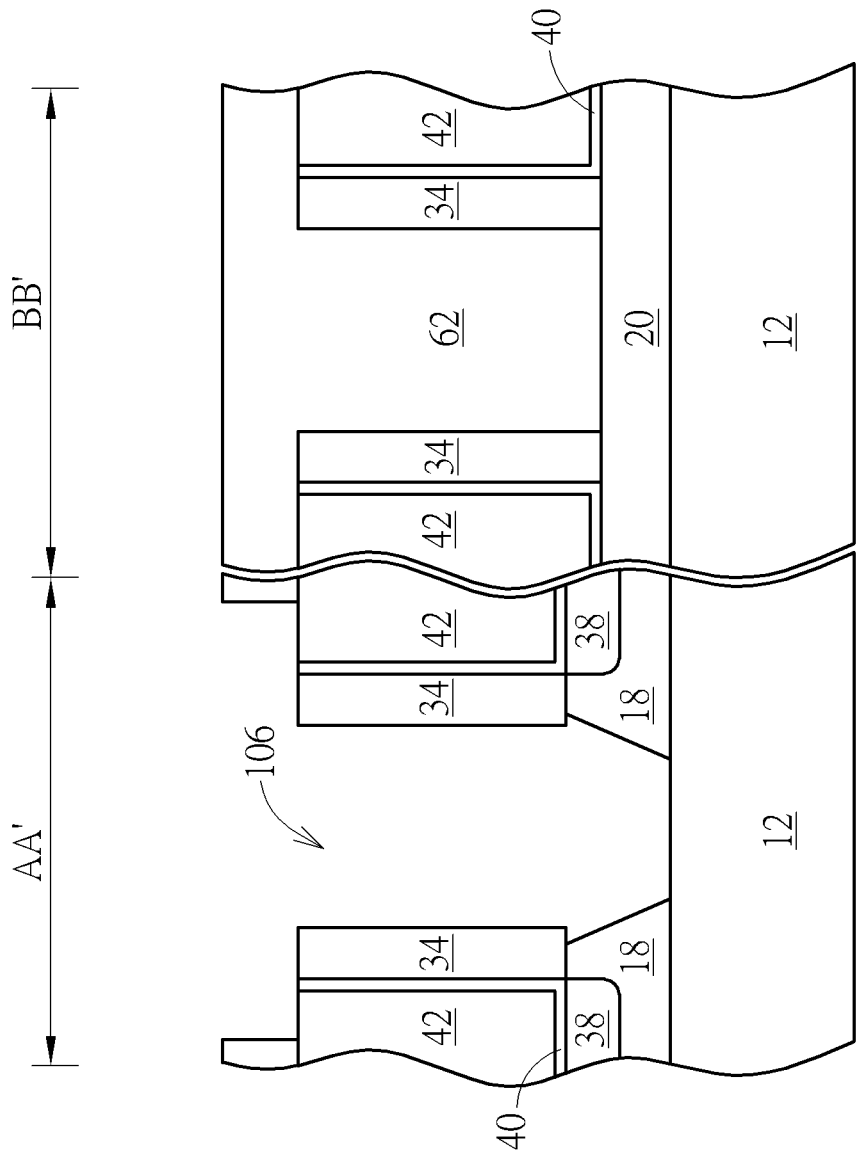

Next, as shown in FIG. 8, a single diffusion break (SDB) fabrication process is conducted to separate or divide the fin-shaped structure 18. For instance, the patterned resist 104 is used as mask to remove part of the first dielectric layer 62 on the fin-shaped structure 18, the patterned resist 104 is selectively removed, and the remaining first dielectric layer 62 on the STI 20 is used as mask to remove part of the gate material layer 32 and part of the fin-shaped structure 18 to form an opening 106. Preferably, the location of the opening 106 would correspond to locations of the gate patterns 52 and 56 in FIG. 5.

Figure 9:
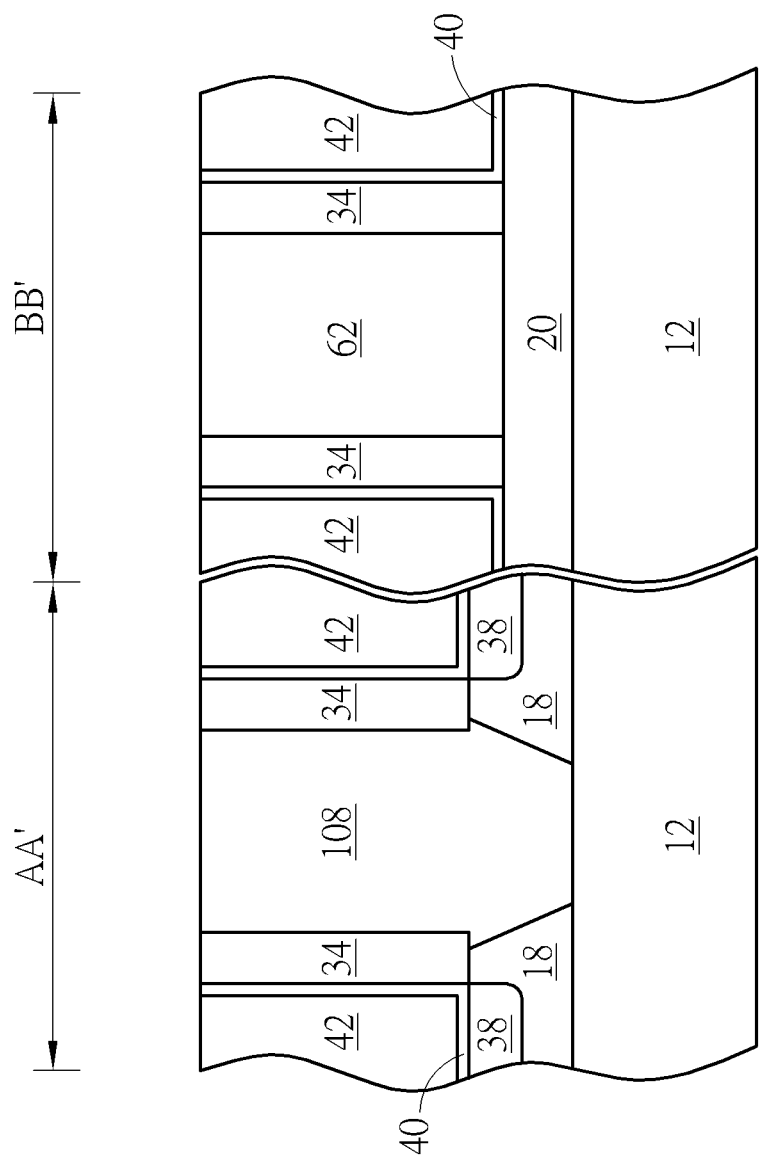

Next, as shown in FIG. 9, a second dielectric layer 108 is formed in the opening 106 and on the first dielectric layer 62, and a planarizing process, such as chemical mechanical polishing (CMP) process is conducted to remove part of the second dielectric layer 108 and part of the first dielectric layer 62 so that the top surfaces of the first dielectric layer 62, the second dielectric layer 108, and the ILD layer 42 are coplanar. The second dielectric layer 108 relative to the positions of the gate patterns 52, 56 and within the fin-shaped structure 18 then forms a single diffusion break isolation. In this embodiment, the first dielectric layer 62 and second dielectric layer 108 are preferably made of different material. For instance, the second dielectric layer 108 in this embodiment is preferably made of silicon oxide, but not limited thereto.

Figure 10:
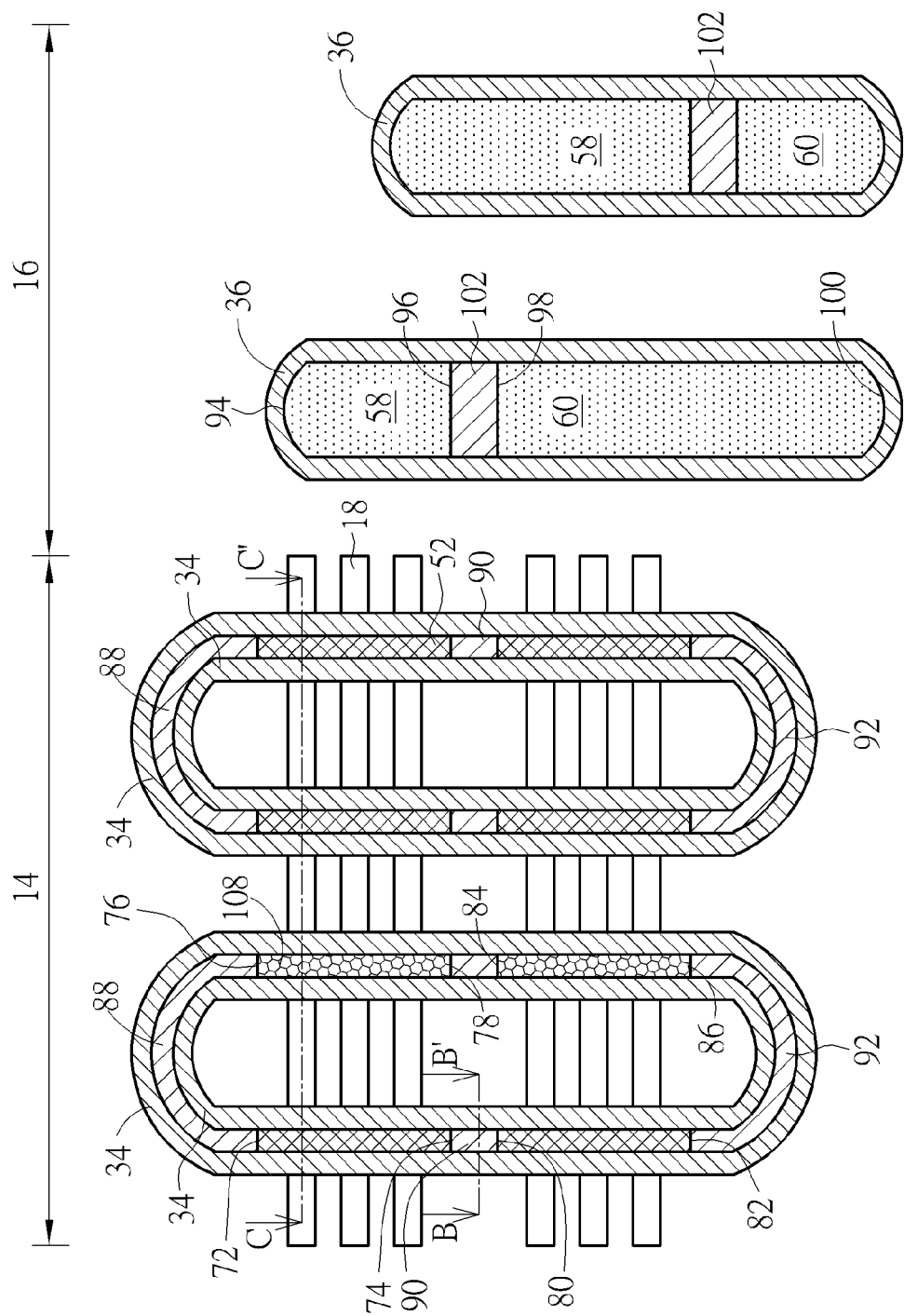
FIG. 10 is a top view illustrating a method for fabricating a semiconductor device following FIG. 9.
Figure 11:
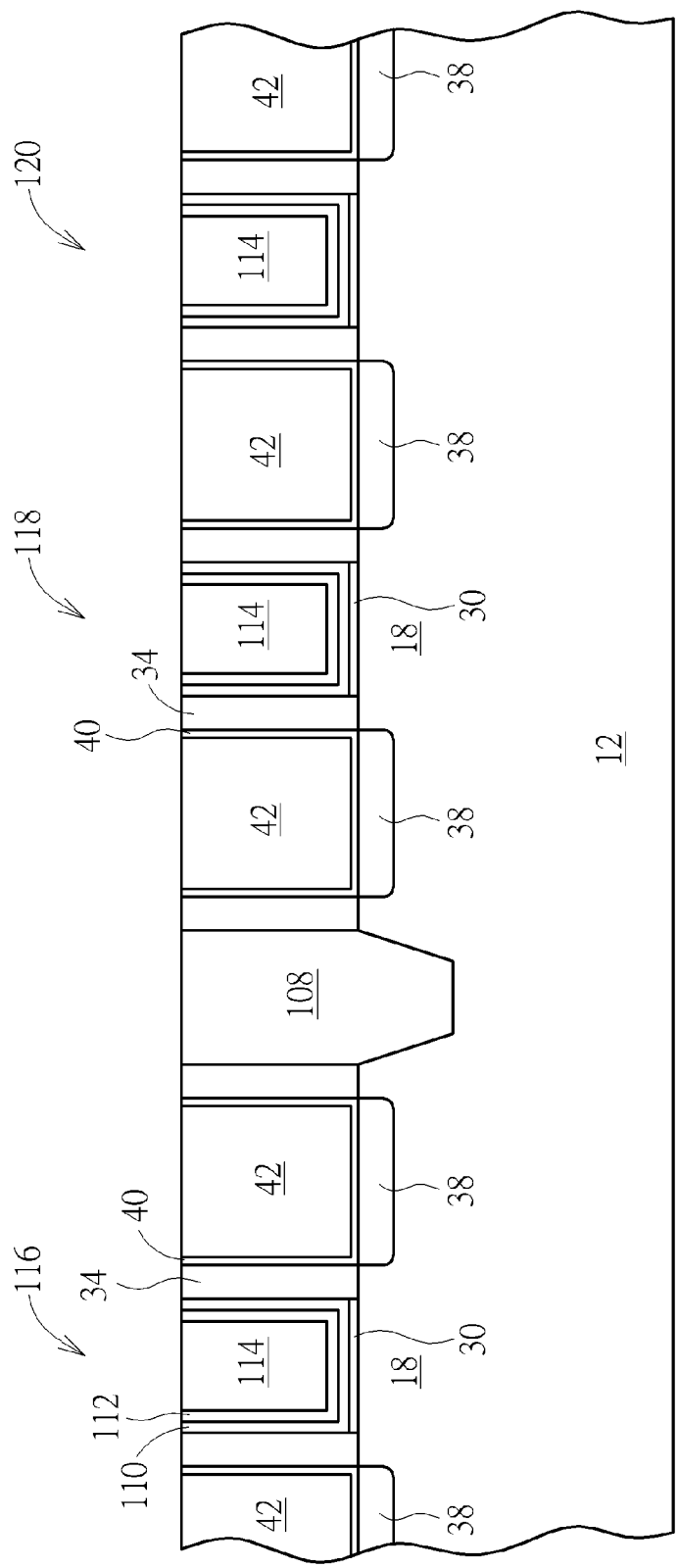
FIG. 11 is a cross-sectional view of FIG. 10 along the sectional line CC'.

Referring to FIGS. 10-11, in which FIG. 10 is a top view illustrating the method for fabricating a semiconductor device following FIG. 9, and FIG. 11 is a cross-sectional view of FIG. 10 along the sectional line CC'. As shown in FIGS. 10-11, a replacement metal gate (RMG) process is conducted to transform the remaining gate patterns 50, 54 into metal gates. For instance, a selective dry etching or wet etching process could be conducted by using etchant including ammonium hydroxide ($NH_4OH$) or tetramethylammonium hydroxide (TMAH) to remove the gate material layer 32 within the gate patterns 50, 54 for forming recesses (not shown) in the ILD layer 42. Next, a high-k dielectric layer 110, a work function metal layer 112, and a low resistance metal layer 114 are sequentially formed in the recesses, and a planarizing process, such as CMP is conducted to remove part of the low resistance metal layer 114, part of the work function metal layer 112, and part of the high-k dielectric layer 110 to form metal gates 116, 118, 120. Since this embodiment pertains to a high-k last process, each of the metal gates 116, 118, 120 preferably includes an interfacial layer or gate dielectric layer 30, a U-shaped high-k dielectric layer 110, a U-shaped work function metal layer 112, and a low resistance metal layer 114.

In this embodiment, the high-k dielectric layer 110 is preferably selected from dielectric materials having dielectric constant (k value) larger than 4. For instance, the high-k dielectric layer 110 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 112 is formed for tuning the work function of the later formed metal gates to be appropriate in an NMOS or a PMOS. For an NMOS transistor, the work function metal layer 112 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 112 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 112 and the low resistance metal layer 114, in which the material of the barrier layer may include titanium (Ti), titanium nitride (TiN), tantalum (Ta) or tantalum nitride (TaN). Furthermore, the material of the low-resistance metal layer 114 may include copper (Cu), aluminum (Al), titanium aluminum (TiAl), cobalt tungsten phosphide (CoWP) or any combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming a first gate pattern on the substrate, wherein the first gate pattern is ring-shaped;
   forming a first spacer around the first gate pattern;
   removing part of the first gate pattern to form a first slot after forming the first spacer;
   forming a first dielectric layer into the first slot; and
   performing a replacement metal gate (RMG) process to transform part of the first gate pattern into a metal gate.

2. The method of claim 1, further comprising:
forming an interlayer dielectric (ILD) layer on the substrate after forming the first spacer;
planarizing part of the ILD layer so that a top surface of the first gate pattern and a top surface of the ILD layer are coplanar; and
removing part of the first gate pattern to form the first slot.

3. The method of claim 1, further comprising:
forming a second gate pattern on the substrate;
forming the first spacer around the first gate pattern and a second spacer around the second gate pattern;
removing part of the first gate pattern and part of the second gate pattern to form the first slot and a second slot; and
forming the first dielectric layer into the first slot and the second slot.

4. The method of claim 3, wherein the second gate pattern is strip-shaped.

5. The method of claim 3, wherein a width of the second gate pattern is greater than a width of the first gate pattern.

6. The method of claim 1, wherein the first dielectric layer comprises silicon nitride.

7. The method of claim 1, wherein a fin-shaped structure is disposed on the substrate and a shallow trench isolation (STI) is disposed around the fin-shaped structure, the method comprises:
forming the first gate pattern on the fin-shaped structure and the STI;
forming the first spacer around the first gate pattern;
removing part of the first gate pattern on the STI to form the first slot;
forming the first dielectric layer into the first slot and on the first gate pattern;
removing part of the first gate pattern on the fin-shaped structure and part of the fin-shaped structure to form an opening;
forming a second dielectric layer into the opening and on the first dielectric layer; and
planarizing the second dielectric layer and the first dielectric layer.

8. The method of claim 7, further comprising:
removing part of the first dielectric layer on the fin-shaped structure; and
using the first dielectric layer on the STI as mask to remove part of the first gate pattern on the fin-shaped structure and part of the fin-shaped structure.

9. The method of claim 7, wherein the first dielectric layer and the second dielectric layer comprise different material.

10. The method of claim 7, wherein the second dielectric layer comprises silicon oxide.

11. A semiconductor device, comprising:
a first gate pattern and a second gate pattern on a substrate, wherein the first gate pattern comprises a first end and a second end and the second gate pattern comprises a third end and a fourth end;
a first dielectric pattern contacting the first end of the first gate pattern and the third end of the second gate pattern;
a second dielectric pattern contacting the second end of the first gate pattern and the fourth end of the second gate pattern; and
a first spacer around the first gate pattern, the second gate pattern, the first dielectric pattern and the second dielectric pattern.

12. The semiconductor device of claim 11, wherein the first dielectric pattern is U-shaped.

13. The semiconductor device of claim 11, wherein first dielectric pattern and the first spacer comprise same material.

14. The semiconductor device of claim 11, wherein each of the first gate pattern and the second gate pattern is strip-shaped.

15. The semiconductor device of claim 11, further comprising:
a third gate pattern and a fourth gate pattern on the substrate, wherein the third gate pattern comprises a fifth end and a sixth end and the fourth gate pattern comprises a seventh end and an eighth end;
the second dielectric pattern contacting the fifth end of the third gate pattern and the seventh end of the fourth gate pattern;
a third dielectric pattern contacting the sixth end of the third gate pattern and the eighth end of the fourth gate pattern; and
the first spacer around the third gate pattern, the fourth gate pattern, the second dielectric pattern, and the third dielectric pattern.

16. The semiconductor device of claim 15, wherein the third dielectric pattern is U-shaped.

17. The semiconductor device of claim 15, wherein the third dielectric pattern and the first spacer comprise same material.

18. The semiconductor device of claim 11, further comprising:
a fifth gate pattern on the substrate, wherein a width of the fifth gate pattern is greater than a width of the first gate pattern;
a fourth dielectric pattern contacting an end of the fifth gate pattern; and
a second spacer around the fifth gate pattern and the fourth dielectric pattern.

19. A semiconductor device, comprising:
a first gate pattern and a second gate pattern on a substrate, wherein the first gate pattern comprises a first end and a second end and the second gate pattern comprises a third end and a fourth end; and
a U-shaped dielectric pattern connecting the first gate pattern and the second gate pattern, wherein two ends of the U-shaped dielectric pattern contacts the first end of the first gate pattern and the third end of the second gate pattern directly.

* * * * *